US010186437B2

(12) United States Patent
Pape et al.

(10) Patent No.: US 10,186,437 B2
(45) Date of Patent: Jan. 22, 2019

(54) SUBSTRATE HOLDER HAVING INTEGRATED TEMPERATURE MEASUREMENT ELECTRICAL DEVICES

(71) Applicant: Lam Research Corporation, Fremont, CA (US)

(72) Inventors: Eric Pape, Campbell, CA (US); Darrell Ehrlich, San Jose, CA (US); Mike Jing, Livermore, CA (US)

(73) Assignee: Lam Research Corporation, Fremont, CA (US)

( * ) Notice: Subject to any disclaimer, the term of this patent is extended or adjusted under 35 U.S.C. 154(b) by 386 days.

(21) Appl. No.: 14/874,991

(22) Filed: Oct. 5, 2015

(65) Prior Publication Data

US 2017/0098564 A1  Apr. 6, 2017

(51) Int. Cl.
| | |
|---|---|
| *H01L 21/67* | (2006.01) |
| *G01K 7/00* | (2006.01) |
| *H01L 21/673* | (2006.01) |
| *H01L 21/683* | (2006.01) |
| *G01K 1/02* | (2006.01) |
| *G01K 1/14* | (2006.01) |

(52) U.S. Cl.
CPC ........ *H01L 21/67248* (2013.01); *G01K 1/026* (2013.01); *G01K 1/14* (2013.01); *G01K 7/00* (2013.01); *H01L 21/67103* (2013.01); *H01L 21/67109* (2013.01); *H01L 21/67346* (2013.01); *H01L 21/6833* (2013.01)

(58) Field of Classification Search
CPC ........ H01L 21/67248; H01L 21/767248; H01J 37/32522; G01K 1/026; G01K 1/14; G01K 7/00; G01K 1/143

USPC ................ 374/178, 137, 163, 141
See application file for complete search history.

(56) References Cited

U.S. PATENT DOCUMENTS

| | | | | |
|---|---|---|---|---|
| 3,529,156 A | * | 9/1970 | Goldberg | C09K 19/36 |
| | | | | 250/474.1 |
| 6,217,212 B1 | * | 4/2001 | Brenninger | B24B 37/013 |
| | | | | 257/E21.528 |
| 6,479,801 B1 | * | 11/2002 | Shigeoka | G01J 5/0003 |
| | | | | 219/497 |
| 6,481,886 B1 | * | 11/2002 | Narendrnath | G01K 11/3213 |
| | | | | 250/458.1 |

(Continued)

FOREIGN PATENT DOCUMENTS

| | | | | |
|---|---|---|---|---|
| WO | WO 2013033336 A1 | * | 3/2013 | H05B 3/20 |
| WO | WO 2013033394 A2 | * | 3/2013 | H05B 3/20 |

*Primary Examiner* — Gail Kaplan Verbitsky
(74) *Attorney, Agent, or Firm* — Martine Penilla Group, LLP

(57) ABSTRACT

A substrate holder includes a base plate, a bond layer disposed over the base plate, and a ceramic layer disposed over the bond layer. The ceramic layer has a top surface including an area configured to support a substrate. A number of temperature measurement electrical devices are attached to the ceramic layer. Electrically conductive traces are embedded within the ceramic layer and positioned and routed to electrically connect with one or more of electrical contacts of the number of temperature measurement electrical devices. Electrical wires are disposed to electrically contact the electrically conductive traces. The electrical wires extend from the ceramic layer through the bond layer and through the base plate to a control circuit.

25 Claims, 12 Drawing Sheets

(56) References Cited

U.S. PATENT DOCUMENTS

| | | | |
|---|---|---|---|
| 7,959,734 B2* | 6/2011 | Hayashi | H01L 21/67103 |
| | | | 118/715 |
| 8,303,716 B2* | 11/2012 | Wallace | H01L 21/67109 |
| | | | 118/724 |
| 9,340,462 B2* | 5/2016 | Harris | H01L 21/67103 |
| 9,698,074 B2* | 7/2017 | Merry | H01L 23/34 |
| 9,851,258 B2* | 12/2017 | Pei | G01J 5/12 |
| 2003/0016727 A1* | 1/2003 | Jones | G01K 11/24 |
| | | | 374/117 |
| 2004/0071945 A1* | 4/2004 | Ito | B32B 18/00 |
| | | | 428/209 |
| 2004/0250762 A1* | 12/2004 | Shigetomi | H01L 21/67103 |
| | | | 118/684 |
| 2008/0181825 A1* | 7/2008 | Hayashi | H01L 21/67103 |
| | | | 422/105 |
| 2008/0224817 A1* | 9/2008 | Vellore | G01K 1/14 |
| | | | 338/25 |
| 2009/0034582 A1* | 2/2009 | Carcasi | G01K 1/026 |
| | | | 374/141 |
| 2012/0241089 A1* | 9/2012 | Dielmann | C23C 16/4586 |
| | | | 156/345.27 |
| 2013/0148693 A1* | 6/2013 | Aggarwal | G01K 7/04 |
| | | | 374/179 |
| 2013/0319762 A1* | 12/2013 | Harris | H01L 21/67103 |
| | | | 174/94 R |
| 2015/0371881 A1* | 12/2015 | Du Bois | H01L 21/67248 |
| | | | 374/141 |
| 2016/0198528 A1* | 7/2016 | Kitagawa | H05B 3/283 |
| | | | 156/345.52 |
| 2017/0373418 A1* | 12/2017 | L'Esperance et al. | |
| | | | H01R 12/721 |
| 2018/0096870 A1* | 4/2018 | Yoshida | H01L 21/67248 |

\* cited by examiner

View A-A

Alternate View A-A

Alternate View A-A

View A-A

View A-A

SUBSTRATE HOLDER HAVING INTEGRATED TEMPERATURE MEASUREMENT ELECTRICAL DEVICES

BACKGROUND

1. Field of the Invention

The present invention relates to semiconductor device fabrication.

2. Description of the Related Art

Many modern semiconductor fabrication processes are performed in plasma process modules in which a substrate is held on a substrate holder in exposure to a plasma. Temperature control of the substrate during plasma processing operations is one factor that can influence the outcome of the processing operations. To provide for control of the substrate temperature during the plasma processing operation, it is necessary to accurately and reliably measure the temperature of the substrate holder so as to infer the temperature of the substrate held thereon. It is within this context that the present invention arises.

SUMMARY

In one example embodiment, a substrate holder is disclosed. The substrate holder includes a base plate, a bond layer disposed over the base plate, and a ceramic layer disposed over the bond layer. The ceramic layer has a top surface including an area configured to support a substrate. The substrate holder includes a number of temperature measurement electrical devices attached to the ceramic layer. Each of the number of temperature measurement electrical devices is configured for measuring a corresponding local temperature of the ceramic layer. Each of the number of temperature measurement electrical devices has a plurality of electrical contact. The substrate holder includes a plurality of electrically conductive traces embedded within the ceramic layer. Some of the plurality of electrically conductive traces are positioned in electrical contact with one or more of the plurality of electrical contacts of the number of temperature measurement electrical devices. The substrate holder also includes a plurality of electrical wires in electrical contact with one or more of the plurality of electrically conductive traces. The plurality of electrical wires extend from the ceramic layer through the bond layer and through the base plate to a control circuit.

In one example embodiment, a system is disclosed. The system includes a substrate holder including a base plate and a ceramic layer attached to a top surface of the base plate using a bond layer disposed between the base plate and the ceramic layer. The ceramic layer has a top surface including an area configured to support a substrate. The system also includes a number of temperature measurement electrical devices attached to the ceramic layer. Each of the number of temperature measurement electrical devices is configured for measuring a corresponding local temperature of the ceramic layer. Each of the number of temperature measurement electrical devices has a plurality of electrical contacts. The ceramic layer includes a plurality of electrically conductive traces embedded within the ceramic layer. Some of the plurality of electrically conductive traces are routed between electrical contacts of the number of temperature measurement electrical devices. Some of the plurality of electrically conductive traces are routed from one or more of the plurality of electrical contacts of the number of temperature measurement electrical devices to a corresponding one of a number of exposed electrical contacts. The system also includes a plurality of electrical wires connected to corresponding ones of the number of exposed electrical contacts. The system also includes a monitoring and control circuit including a plurality of electrical nodes respectively in electrical contact with the plurality of electrical wires. The monitoring and control circuit is configured to control operation of the number of temperature measurement electrical devices.

In one example embodiment, a method is disclosed for manufacturing a substrate holder. The method includes forming a ceramic layer having a top surface including an area configured to support a substrate. The ceramic layer is formed to include a number of temperature measurement electrical devices. The ceramic layer is formed to include embedded electrically conductive traces routed to electrically connect the number of temperature measurement electrical devices to a number of exposed electrical contacts at a bottom surface of the ceramic layer. The method also includes connecting a number of electrical wires to the number of exposed electrical contacts, respectively. The method also includes securing the ceramic layer to a base plate using a bond layer, such that the number of electrical wires are routed through the bond layer and through the base plate. The method also includes connecting the number of electrical wires to a control circuit.

In one example embodiment, a method is disclosed for measuring temperature of a substrate holder. The method includes supplying electrical power through a first number of electrically conductive traces embedded within a ceramic layer of the substrate holder to a number of temperature measurement electrical devices within the ceramic layer. The method also includes connecting the number of temperature measurement electrical devices within the ceramic layer through a second number of electrically conductive traces embedded within the ceramic layer to a reference ground potential. The method also includes supplying control signals through a third number of electrically conductive traces embedded within the ceramic layer of the substrate holder to the number of temperature measurement electrical devices within the ceramic layer to direct the number of temperature measurement electrical devices to measure corresponding local temperatures of the ceramic layer. The method also includes receiving temperature measurement data signals from the number of temperature measurement electrical devices within the ceramic layer through a fourth number of electrically conductive traces embedded within the ceramic layer of the substrate holder.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
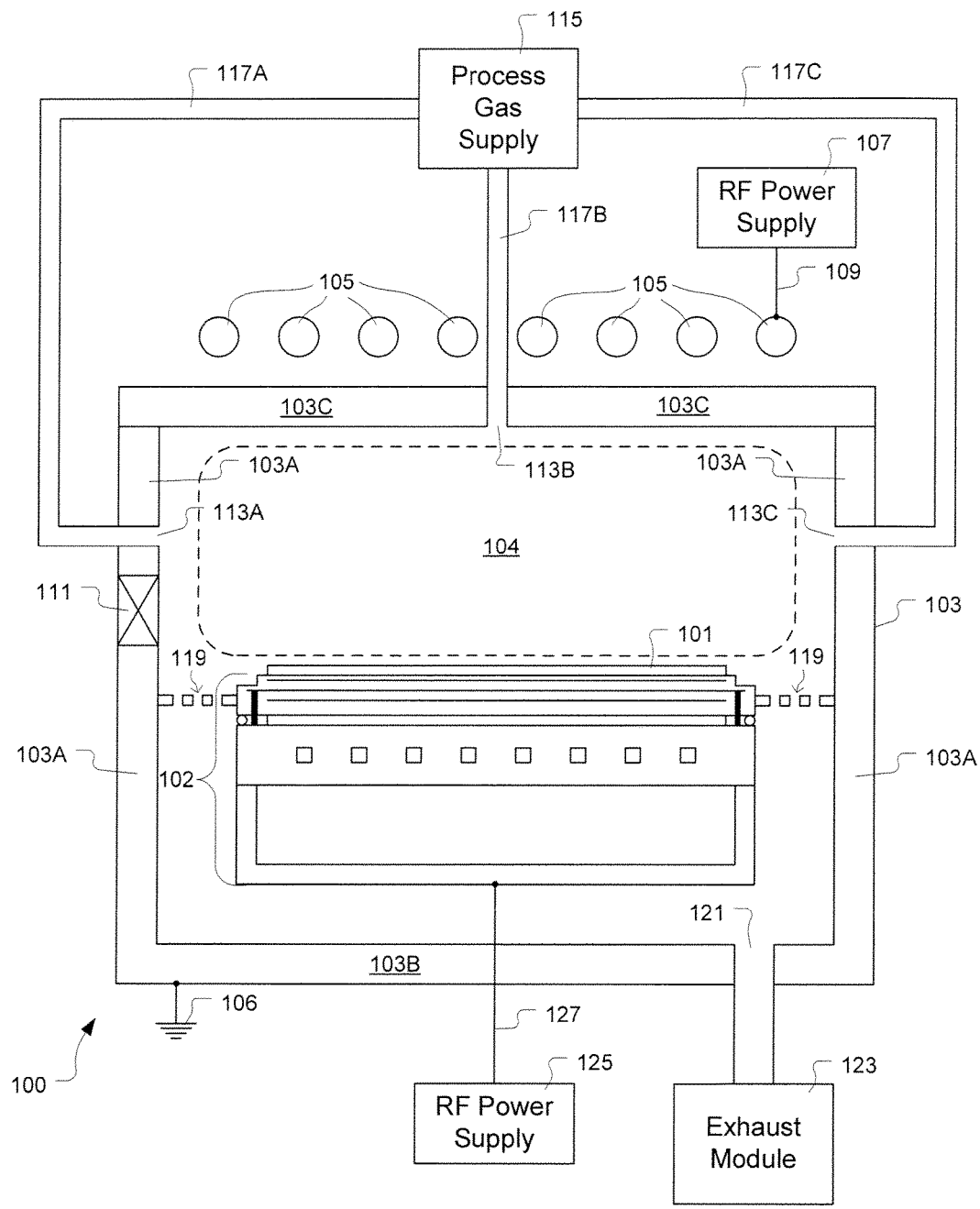
FIG. 1 shows an example substrate process module, in accordance with various embodiments of the present invention.

FIG. 1 shows an example substrate process module 100, in accordance with various embodiments of the present invention. The process module 100 includes a substrate holder 102 configured to hold a substrate 101 in exposure to a plasma processing environment in which a plasma 104 is generated. The present disclosure primarily concerns apparatuses, systems, and methods by which the temperatures of various portions of the substrate holder 102 can be measured during plasma processing operations within the process module 100. To provide example context, the process module 100 is depicted as an inductively coupled plasma (ICP) process module. However, it should be understood that in other embodiments the process module 100 can be defined as other types of process modules used in semiconductor fabrication.

In an example embodiment, the term substrate 101 as used herein refers to a semiconductor wafer. However, it should be understood that in other embodiments, the term substrate 101 as used herein can refer to substrates formed of sapphire, GaN, GaAs or SiC, or other substrate materials, and can include glass panels/substrates, metal foils, metal sheets, polymer materials, or the like. Also, in various embodiments, the substrate 101 as referred to herein may vary in form, shape, and/or size. For example, in some embodiments, the substrate 101 as referred to herein may correspond to a 200 mm (millimeters) semiconductor wafer, a 300 mm semiconductor wafer, or a 450 mm semiconductor wafer. Also, in some embodiments, the substrate 101 as referred to herein may correspond to a non-circular substrate, such as a rectangular substrate for a flat panel display, or the like, among other shapes.

The process module 100 is configured to provide for exposure of the substrate 101 to a plasma-based processing operation in order to modify characteristics of the substrate 101 in a prescribed and controlled manner. The process module 100 includes a chamber 103 defined by surrounding structures, including one or more wall structures 103A, a bottom structure 103B, and a top structure 103C. In some embodiments, the top structure 103C is formed of a material through which radiofrequency (RF) signals can be transmitted, such as quartz or ceramic, among others. The process module 100 includes a coil assembly 105 disposed above the top structure 103C.

An RF power supply 107 is connected to supply RF power (RE signals) to the coil assembly 105 through a connection 109. In various embodiments, the RF power supply 107 includes one or more RF generators and associated impedance matching circuitry to provide for proper transmission of the RF power to coil assembly 105. The chamber 103 can be formed of an electrically conductive material and have an electrical connection to a reference ground potential 106.

In some embodiments, the process module 100 includes a closable access port 111, such as a gate valve or other component, through which the substrate 101 can be transferred into and out of the chamber 103. The process module 100 also includes a number of process gas supply ports 113A, 113B, 113C through which one or more process gas composition(s) can be supplied to the interior region of the chamber 103 overlying the substrate holder 102. During operation, a process gas supply 115 operates to deliver the one or more process gas composition(s) through one or more connection lines 117A, 117B, 117C to the process gas supply ports 113A, 113B, 113C, respectively, and RF power is delivered from the RF power supply 107 to the coil assembly 105, such that the RF power generates an electromagnetic field within a plasma generation region below the top structure 103O and overlying the substrate holder 102 so as to transform the one or more process gas composition(s) within the plasma generation region into the plasma 104. Then, reactive constituents of the plasma 104, such as ions and/or radicals, interact with portions of the exposed surfaces of the substrate 101.

The process module 100 includes a number of side vent structures 119 through which gases and by-product materials can flow to an exhaust port 121, which is connected to an exhaust module 123 configured to apply a negative pressure to the interior of the chamber 103 to facilitate exhaust of the used process gases and by-product materials. Also, in some embodiments, the substrate holder 102 is configured to receive RF power from another RF power supply 125 through a connection 127 to contribute to generation of the plasma 104 and/or to provide for generation of a bias voltage on the substrate holder 102 in order to attract ions from the plasma 104 toward the substrate holder 102 and substrate 101 held thereon. In various embodiments, the RF power supply 125 includes one or more RF generators and associated impedance matching circuitry to provide for proper transmission of the RF power to substrate holder 102.

Although the process module 100 depicts an example of an ICP process module, in various embodiments, the process module 100 can be essentially any type of process module used in semiconductor device fabrication. For example, in some embodiments, the process module 100 can be a capacitively coupled plasma (CCP) process module in which, instead of the coil assembly 105 used in the ICP process module, the CCP process module includes one or more electrodes disposed within the chamber 103, with RF power delivered to the one or more electrodes. In the CCP process module, the one or more electrodes can include one or more of a top electrode (e.g., a showerhead electrode or solid electrode, among others), a bottom electrode (e.g., an electrostatic chuck or substrate support, among others), and a side electrode (e.g., a peripheral ring-shaped electrode, among others), where the top, bottom, and side electrodes are configured around the plasma generation region. The RF power delivered to the one or more electrodes of the CCP process module is transmitted from the one or more electrodes through the one or more process gas composition(s) present within the plasma generation region to a reference ground potential, and in doing so transforms the one or more process gas composition(s) within the plasma generation region into the plasma 104.

It should be understood that the ICP and CCP process module examples mentioned above are discussed in a simplified manner for ease of description. In reality, the process module 100, whether ICP, CCP, or some other type, is a complex system that includes many components not described herein. However, what should be appreciated for the present discussion is that process module 100, regardless of type, includes the substrate holder 102 configured to hold the substrate 101 in a secured manner in exposure to the plasma 104 to enable processing of the substrate 101 to obtain a specific result. Examples of plasma processing operations that may performed by the process module 100 include etching operations, deposition operations, and aching operations, among others.

Figure 2A:
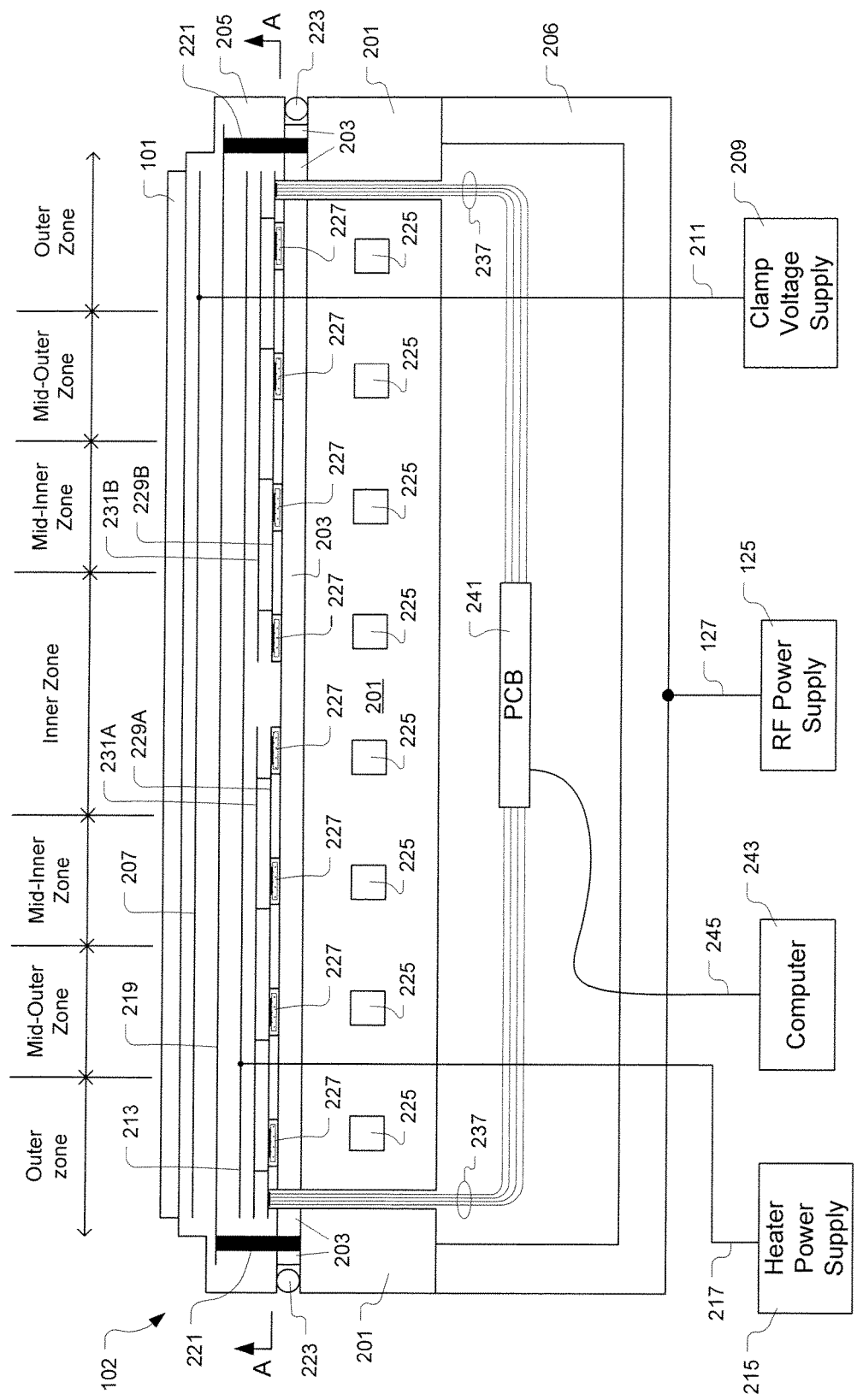
FIG. 2A shows a vertical cross-section view of an example of the substrate holder configured as an electrostatic chuck, in accordance with various embodiments of the present invention.

In various embodiments, the substrate holder 102 can be an electrostatic chuck or other type of substrate support member. FIG. 2A shows a vertical cross-section view of an example of the substrate holder 102 configured as an electrostatic chuck, in accordance with various embodiments of the present invention. The substrate holder 102 includes a base plate 201, a bond layer 203 disposed over the base plate 201, and a ceramic layer 205 disposed over the bond layer 203. The bond layer 203 secures the ceramic layer 205 to the base plate 201. The bond layer 203 also acts as a thermal break between the ceramic layer 205 and the base plate 201.

The base plate 201 is structurally secured to a facilities module 206, such that electrical continuity is established between the base plate 201 and the facilities module 206 so as to enable transmission of RF power from the RF power supply 125 over the facilities module 206 to the base plate 201. The facilities module 206 is configured as a hollow, electrically conductive structure for housing various support components of the substrate holder 102 in isolation from the plasma environment present within the chamber 103. In some embodiments, the base plate 201 and facilities module 206 are formed of aluminum. However, in other embodiments, the base plate 201 and facilities module 206 can be formed of other materials or combinations of materials, so long as the base plate 201 and facilities module 206 provide sufficient electrical conduction, thermal conduction, and mechanical strength to support operation of the substrate holder 102.

A top surface of the ceramic layer 205 includes an area configured to support the substrate 101 during processing. In some embodiments, the top surface of the ceramic layer 205 is formed by co-planar top surfaces of multiple raised structures referred to as mesa structures. With the substrate 101 supported on the top surfaces of the mesa structures, the regions between the sides of the mesa structures provide for flow of a fluid, such as helium gas, against the backside of the substrate 101 to provide for enhanced temperature control of the substrate 101.

The ceramic layer 205 includes one or more clamp electrodes 207 in electrical connection with a clamp voltage supply 209 through an electrical connection 211. In some embodiments, the one or more clamp electrodes 207 can be a single electrode used to generate an electrical field for holding the substrate 101 on the top surface of the ceramic layer 205. In some embodiments, the clamp electrode 207 can include two separate clamp electrodes configured for bipolar operation in which a differential voltage is applied between the two separate clamp electrodes to generate an electrical field for holding the substrate 101 on the top surface of the ceramic layer 205. In various embodiments, the two separate clamp electrodes can be geometrically interdigitated or interleaved to enable the bipolar operation.

In some embodiments, the ceramic layer 205 includes a resistance heater 213 in electrical connection with a heater power supply 215 through an electrical connection 217. Also, in some embodiments, the ceramic layer 205 includes an RF power delivery electrode 219 and associated RF power delivery connection modules 221 distributed in a substantially uniform manner about a perimeter of the ceramic layer 205. Each of the RF power delivery connection modules 221 provides a low impedance transmission path for RF signals between the base plate 201 and the RF power delivery electrode 219. More specifically, each of the RF power delivery connection modules 221 is configured to form an electrical connection from the base plate 201 to the RF power delivery electrode 219 at its respective location so as to form an RF power transmission path from the base plate 201 to the RF power delivery electrode 219 at its respective location. In this manner, the base plate 201, the RF power delivery connection modules 221, and the RF power delivery electrode 219 together form a Faraday cage to direct RF power transmission around an internal volume of the substrate holder 102 present between the top surface of the base plate 201 and the RF power delivery electrode 219 and within a circumference proximate to a radial perimeter of the ceramic layer 205 along which the RF power delivery connection modules 221 are located, thereby shielding the internal volume of the substrate holder 102 from RF signals that may interfere with operation of electrical components present within the internal volume of the substrate holder 102.

In some embodiments, the substrate holder 102 includes a perimeter seal 223 disposed between a bottom surface of the ceramic layer 205 and a top surface of the base plate 201 outside a radial perimeter of the bond layer 203. The perimeter seal 223 is configured to prevent entry of plasma 104 constituents and/or process by-product materials to interior regions at which the ceramic layer 205 and base plate 201 interface with the bond layer 203.

In various embodiments, the substrate holder 102 can be configured to include various cooling mechanisms, heating mechanisms, clamping mechanisms, bias electrodes, substrate lifting pins, and sensors, where the sensors can provide for measurement of temperature, electrical voltage, and/or electrical current, among other parameters. For example, the base plate 201 can be configured to include a number of cooling channels 225 through which a cooling fluid can be flowed. Also, the ceramic layer 205 can include an arrangement of fluid flow channels through which a backside gas can be flowed and dispensed into the region between the mesa structures underlying the substrate 101. It should be appreciated that the facilities module 206 can be configured to hold various circuitry, plumbing, control components, and supporting parts for the internal components of the substrate holder 102, such as for the resistance heater 213, backside gas delivery system, substrate lifting pins, clamp electrode(s) 207, cooling channels 225, sensors, etc.

In particular regard to temperature sensors present within the substrate holder 102, various embodiments of the present invention include a number of temperature measurement electrical devices 227 disposed within the ceramic layer 205. Each of the number of temperature measurement electrical devices 227 is configured for measuring a corresponding local temperature of the ceramic layer 205. Also, each of the number of temperature measurement electrical devices 227 has a plurality of electrical contacts. In some embodiments, each of the number of temperature measurement electrical devices 227 is a separate integrated circuit chip configured to measure temperature. In some embodiments, these integrated circuit chips are configured to store measured temperature data and provide for transmission of temperature measurement data to other circuitry.

Figure 2B:
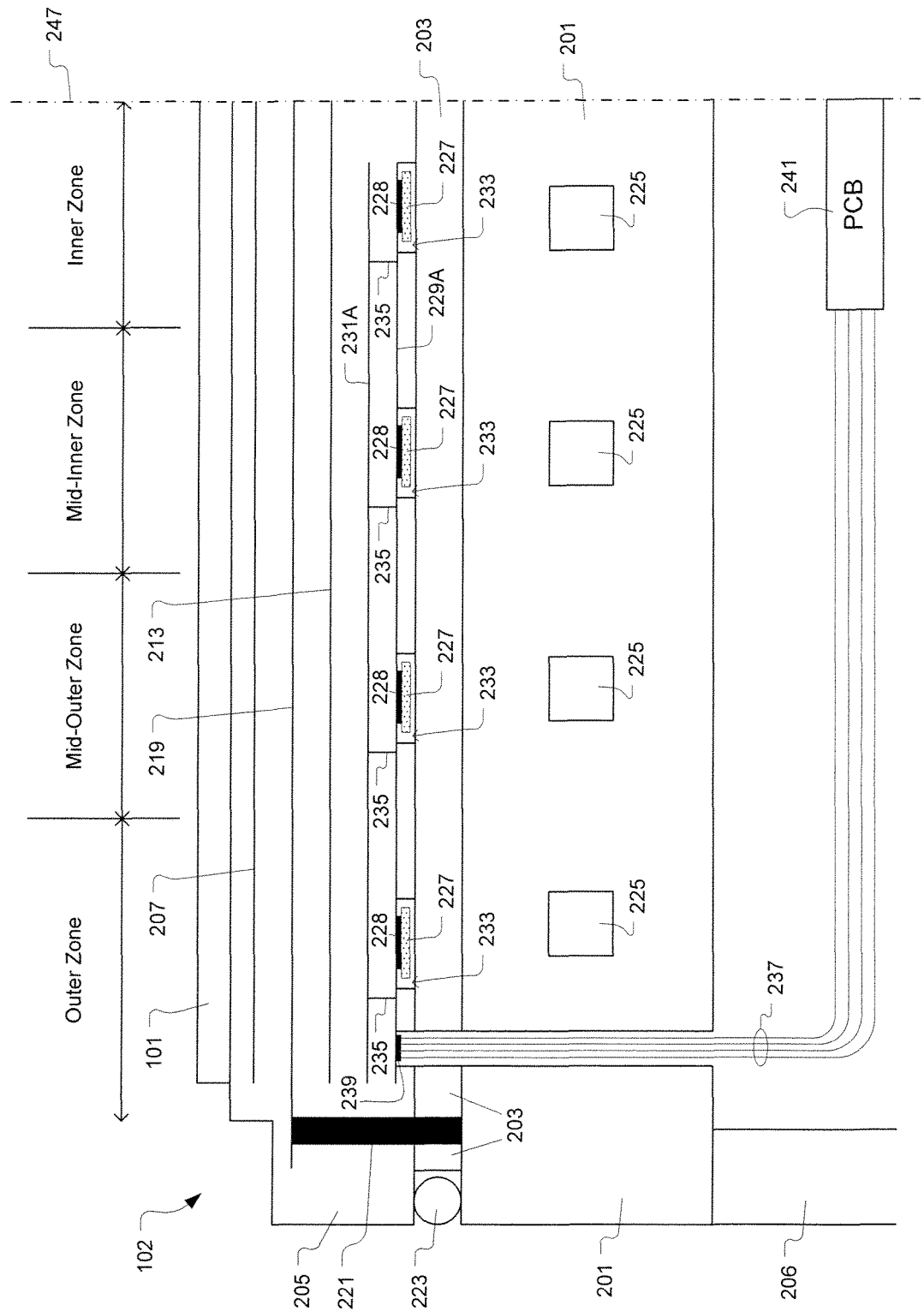
FIG. 2B shows an enlarged view of one-half of the vertical cross-section of the substrate holder as shown in FIG. 2A, in accordance with various embodiments of the present invention.

FIG. 2B shows an enlarged view of one-half of the vertical cross-section of the substrate holder 102 as shown in FIG. 2A, in accordance with various embodiments of the present invention. In some embodiments, each of the number of temperature measurement electrical devices 227 is secured to the ceramic layer 205 by a thermally conductive securing material 228 to provide for good thermal contact between the temperature measurement electrical device 227 and the ceramic layer 205. In various embodiments, the thermally conductive securing material 228 is a solder material or an adhesive material.

Also, in some embodiments, the ceramic layer 205 includes a number of recessed areas 233 distributed across the bottom surface of the ceramic layer 205. In some embodiments, each of the number of recessed areas 233 is configured as a counter-bore formed within the ceramic layer 205 to receive a corresponding one of the number of temperature measurement electrical devices 227, such that each of the number of temperature measurement electrical devices 227 is located between the top and bottom surfaces of the ceramic layer 205 when disposed within its recessed area 233. In some embodiments, a depth of the counter-bore is less than about one-quarter of a total thickness of the ceramic layer 205 as measured perpendicularly between the top and bottom surfaces of the ceramic layer 205. For example, if the total thickness of the ceramic layer 205 is about 4 millimeters (mm) to 5 mm, then the depth of the counter-bore of the recessed area 233 may be about 1 mm. Also, in some embodiments, the substrate holder 102 can include different recessed areas 233 that have different counter-bore depths. In some embodiments, a diameter of each recessed area is less than about 5 mm.

In some embodiments, a backfill material is disposed within each of the number of recessed areas 233 to cover the corresponding number of temperature measurement electrical devices 227 and fill each of the number of recessed areas 233 to a level substantially even with the bottom surface of the ceramic layer 205. In these embodiments, the backfill material will be a dielectric material and will have a controlled thermal conductivity. For example, in some embodiments, the backfill material can be a high thermal conductivity epoxy, a high thermal conductivity silicone, a high thermal conductivity doped silicone, among others. Alternatively, in some embodiments, the number of temperature measurement electrical devices 227 can be surface-mounted on the bottom surface of the ceramic layer 205, with a top surface of the bond layer 203 modified/shaped to accommodate volumes occupied by the number of temperature measurement electrical devices 227 when the ceramic layer 205 is disposed on the bond layer 203.

As shown in FIGS. 2A and 2B, the substrate holder 102 includes a plurality of electrically conductive traces, e.g., 229A, 229B, 231A, 231B, embedded within the ceramic layer 205. Some of the plurality of electrically conductive traces 229A, 229B, etc., are positioned in electrical contact with one or more of the plurality of electrical contacts of the number of temperature measurement electrical devices 227. In some embodiments, the plurality of electrically conductive traces 229A, 229B, 231A, 231B, etc., are routed through multiple levels of the ceramic layer 205 using electrically conductive pads and corresponding via structures 235 formed to extend vertically within the ceramic layer 205. In some embodiments, the plurality of electrically conductive traces 229A, 229B, 231A, 231B, etc., include tungsten as an electrical conductor. In some embodiments, the plurality of electrically conductive traces 229A, 229B, 231A, 231B, etc., include one or more of molybdenum, tantalum, tungsten, palladium, ruthenium, platinum, among others, for electrical conductivity. In some embodiments, the plurality of electrically conductive traces 229A, 229B, 231A, 231B, etc., are co-fired with the ceramic layer 205 such that the plurality of electrically conductive traces 229A, 229B, 231A, 231B, etc., have a temperature response substantially equal to a temperature response of the ceramic layer 205. More specifically, a thermal conductivity of the plurality of electrically conductive traces 229A, 229B, 231A, 231B, etc., is about equal to a thermal conductivity of the ceramic layer 205 within which the plurality of electrically conductive traces 229A, 229B, 231A, 231B, etc., is formed.

It should be understood that the plurality of electrically conductive traces 229A, 229B, 231A, 231B, etc., are embedded within the ceramic layer 205 such that the ceramic layer 205 includes the interconnect conductors for the number of temperature measurement electrical devices 227. In various embodiments, the plurality of electrically conductive traces 229A, 229B, 231A, 231B, etc., can be formed using different methods including but not limited to screen printing of conductive inks following by sintering of the ceramic layer 205, physical vapor deposition, electroplating, lithographic mask/etch/fill processes, among others. In some embodiments, each of the plurality of electrically conductive traces 229A, 229B, 231A, 231B, etc., is about 10 micrometers thick.

In some embodiments, a number of electrically conductive mounting pads are respectively secured within the number of recessed areas 233, with each of the number of electrically conductive mounting pads being electrically connected to a ground bus formed by one or more of the plurality of electrically conductive traces 229A, 229B, etc. In these embodiments, each of the number of temperature measurement electrical devices 227 has an exposed ground pad soldered to a respective one of the number of electrically conductive mounting pads. In these embodiments, a majority of the heat transfer from the ceramic layer 205 to the number of temperature measurement electrical devices 227 occurs through the corresponding number of electrically conductive mounting pads and associated solder connections.

The substrate holder 102 also includes a plurality of electrical wires 237 in electrical contact with one or more of the plurality of electrically conductive traces 229A, 229B, 231A, 231B, etc. In some embodiments, the plurality of electrical wires 237 extend from the ceramic layer 205 through the bond layer 203 and through the base plate 201 to a control circuit. In some embodiments, some of the plurality of electrically conductive traces 229A, 229B, 231A, 231B, etc., are routed between electrical contacts of the number of temperature measurement electrical devices 227. And, in some embodiments, some of the plurality of electrically conductive traces 229A, 229B, 231A, 231B, etc., are routed from one or more of the plurality of electrical contacts of the number of temperature measurement electrical devices 227 to a corresponding one of a number of exposed electrical contacts 239, with the plurality of electrical wires 237 respectively connected to corresponding ones of the number of exposed electrical contacts 239.

In some embodiments, the control circuit to which the plurality of electrical wires 237 are routed includes a plurality of electrical nodes respectively in electrical contact with the plurality of electrical wires 237. In some embodiments, the control circuit is implemented on a circuit board 241. The control circuit is configured to control operation of the number of temperature measurement electrical devices 227 and receive temperature measurement data from the number of temperature measurement electrical devices 227. It should be appreciated that data communication between the control circuit and the number of temperature measurement electrical devices 227 is performed using digital signals. In some embodiments, the circuit board 241 is singularly associated with the substrate holder 102. And, in some embodiments, the circuit board 241 is disposed below the base plate 201 within the facilities module 206. Also, in some embodiments, the circuit board 241 includes a data jack for communication of data to and from a computer 243 external to the substrate holder 102 through a connection 245. In some embodiments, temperature measurement data provided by the of temperature measurement electrical devices 227 can be communicated to a temperature control system for providing closed-loop feedback temperature control of the substrate holder 102.

In some embodiments, the number of temperature measurement electrical devices 227 are distributed within multiple temperature measurement zones, where the multiple temperature measurement zones are defined in a concentric manner about a centerline 247 of the ceramic layer 205 extending perpendicularly through a center of the top surface of the ceramic layer 205. For example, the substrate holder 102 of FIG. 2A includes four temperature measurement zones, including an inner zone, a mid-inner zone, a mid-outer zone, and an outer zone. However, it should be understood that in other embodiments the substrate holder 102 can be configured to include essentially any number of temperature measurement zones. In some embodiments, the temperature measurement zones are defined to spatially correspond to heater control zones as provided by the resistance heater 213.

In some embodiments, the number of temperature measurement electrical devices 227, and the plurality of electrically conductive traces 229A, 229B, 231A, 231B, etc., embedded within the ceramic layer 205, and the plurality of electrical wires 237 are separated into multiple temperature measurement arrays. In some embodiments, each of the multiple temperature measurement arrays includes: a) separate temperature measurement electrical devices 227 respectively disposed within different ones of the multiple temperature measurement zones, and b) a dedicated set of the plurality of electrically conductive traces 229A, 229B, 231A, 231B, etc., embedded within the ceramic layer 205, and c) a dedicated set of the plurality of electrical wires 237. In this manner, the single dedicated set of the plurality of electrical wires 237 is provided to service all of the separate temperature measurement electrical devices 227 within the one corresponding temperature measurement array.

Figure 3A:
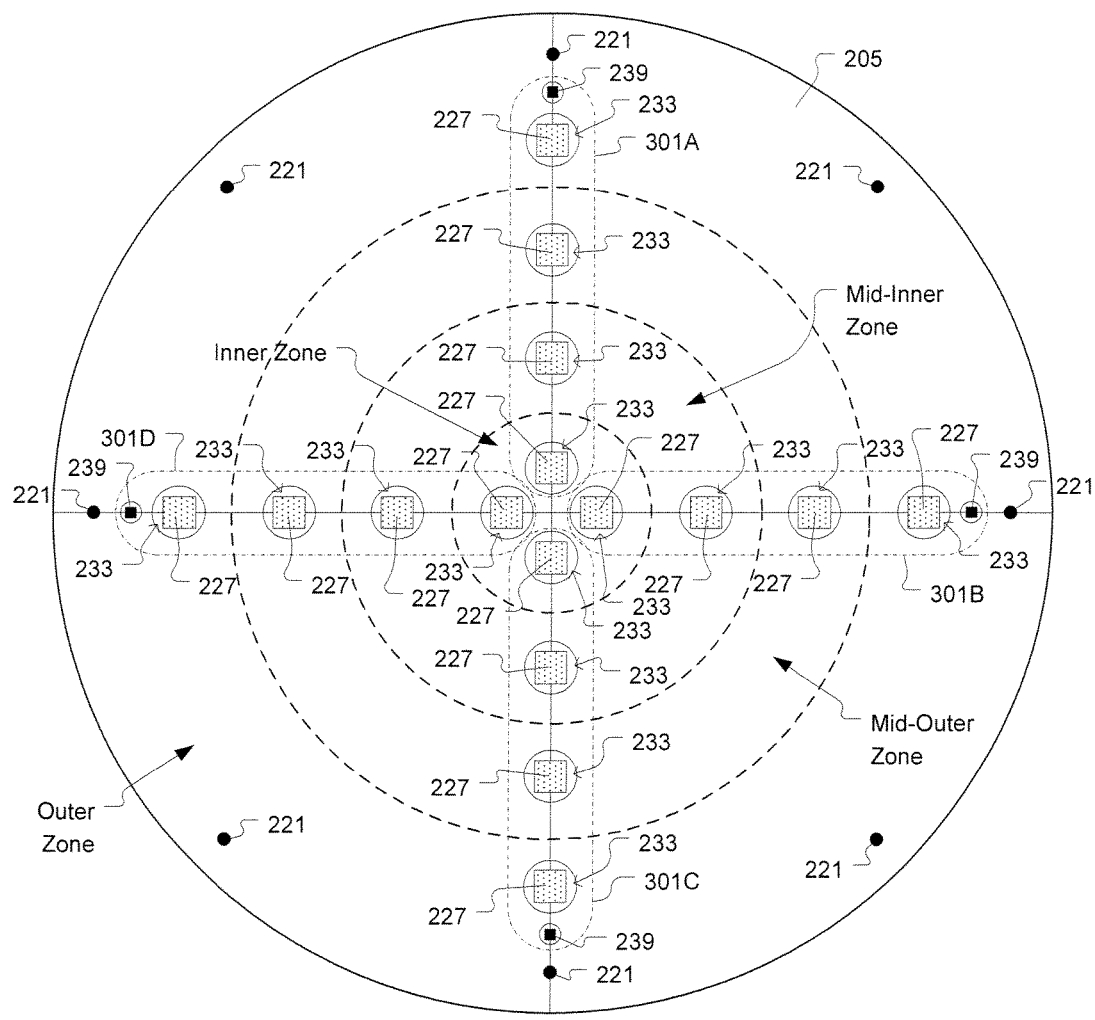
FIG. 3A shows an example arrangement of multiple temperature measurement arrays, in accordance with various embodiments of the present invention.

FIG. 3A shows an example arrangement of multiple temperature measurement arrays, in accordance with various embodiments of the present invention. The View A-A of FIG. 3A is referenced in FIG. 2A. In the example of FIG. 3A, the substrate holder 102 includes four temperature measurement arrays 301A, 301B, 301C, 301D. Each temperature measurement array 301A, 301B, 301C, 301D includes four temperature measurement electrical devices 227 distributed among the four temperature measurement zones. In some embodiments, each of the temperature measurement electrical devices 227 is disposed within a respective recessed area 233 formed within the ceramic layer 205. In some embodiments, each of the temperature measurement electrical devices 227 can be attached to a bottom surface of the ceramic layer 205. Each of the temperature measurement arrays 301A, 301B, 301C, 301D includes a respective set of exposed electrical contacts 239 and a respective set of the plurality of electrical wires 237.

Figure 3B:
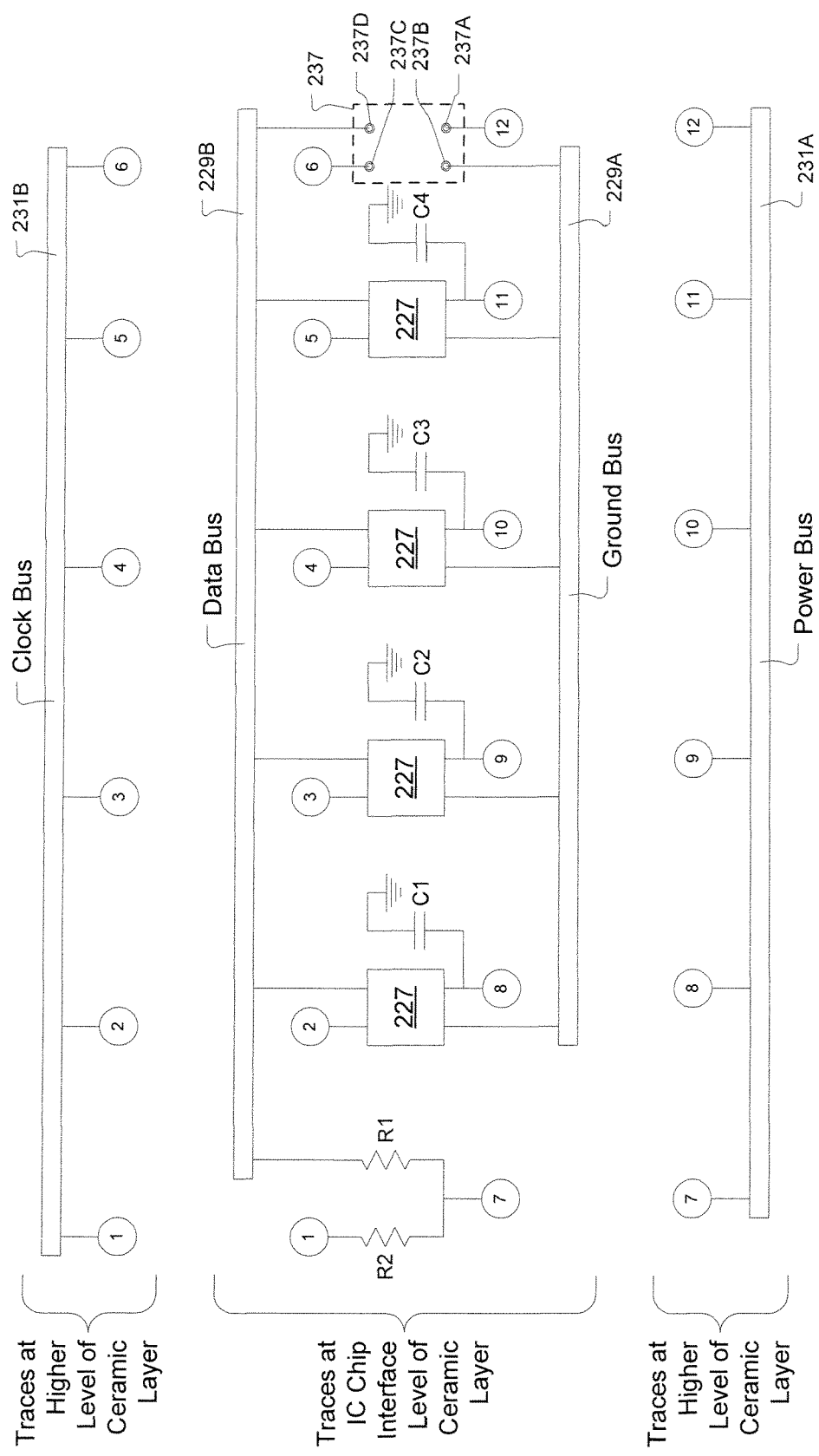
FIG. 3B shows an example layout of the plurality of electrically conductive traces for a given one of the multiple temperature measurement arrays depicted in FIG. 3A, in accordance with various embodiments of the present invention.

FIG. 3B shows an example layout of the plurality of electrically conductive traces 229A, 229B, 231A, 231B, etc., for a given one of the multiple temperature measurement arrays 301A, 301B, 301C, 301D depicted in FIG. 3A, in accordance with various embodiments of the present invention. The plurality of electrically conductive traces 229A, 229B, 231A, 231B, etc., for a given one of the multiple temperature measurement arrays 301A, 301B, 301C, 301D includes a first set of electrically conductive traces 231A for supply of electrical power to each of the temperature measurement electrical devices 227, e.g., integrated circuit chips, within the given one of the multiple temperature measurement arrays 301A, 301B, 301C, 301D. Also, in this example embodiment, the plurality of electrically conductive traces 229A, 229B, 231A, 231B, etc., for a given one of the multiple temperature measurement arrays 301A, 301B, 301C, 301D includes and a second set of electrically conductive traces 229A to provide a reference ground potential to each of the temperature measurement electrical devices 227, e.g., integrated circuit chips, within the given one of the multiple temperature measurement arrays 301A, 301B, 301C, 301D. Also, in this example embodiment, the plurality of electrically conductive traces 229A, 229B, 231A, 231B, etc., for a given one of the multiple temperature measurement arrays 301A, 301B, 301C, 301D includes a third set of electrically conductive traces 231B for supply of a clock signal to each of the temperature measurement electrical devices 227, e.g., integrated circuit chips, within the given one of the multiple temperature measurement arrays 301A, 301B, 301C, 301D. Also, in this example embodiment, the plurality of electrically conductive traces 229A, 229B, 231A, 231B, etc., for a given one of the multiple temperature measurement arrays 301A, 301B, 301C, 301D includes a fourth set of electrically conductive traces 229B for communication of data to and from each of the temperature measurement electrical devices 227, e.g., integrated circuit chips, within the given one of the multiple temperature measurement arrays 301A, 301B, 301C, 301D.

In the above-mentioned example embodiment, the plurality of electrical wires 237 for the given one of the multiple temperature measurement arrays 301A, 301B, 301C, 301D includes a first wire 237A for supplying electrical power of the first set of electrically conductive traces 231A, and a second wire 237B for connecting the second set of electrically conductive traces 229A to the reference ground potential, and a third wire 237C for supplying the clock signal to the third set of electrically conductive traces 231B, and a fourth wire 237D for communicating data to and from the fourth set of electrically conductive traces 229B. In this manner, the first set of electrically conductive traces 231A forms a power bus, and the second set of electrically conductive traces 229A forms a ground bus, and third set of electrically conductive traces 231B forms a clock bus, and the fourth set of electrically conductive traces 229B forms a data bus.

Also, due to connection requirements of the different temperature measurement electrical devices 227, it may be necessary to route the first set of electrically conductive traces 231A, the second set of electrically conductive traces 229A, the third set of electrically conductive traces 231B, and the fourth set of electrically conductive traces 229B in different levels of the ceramic layer 205 to avoid shorting together of different electrically conductive traces 229A, 229B, 231A, 231B. For example, FIG. 3B shows that the second set of electrically conductive traces 229A for the ground bus and the fourth set of electrically conductive traces 229B for the data bus are formed in the same level of the ceramic layer 205. More specifically, the second set of electrically conductive traces 229A for the ground bus and the fourth set of electrically conductive traces 229B for the data bus are formed at the integrated circuit chip interface level of the ceramic layer 205.

FIG. 3B also shows that the first set of electrically conductive traces 231A for the power bus and the third set of electrically conductive traces 231B for the clock bus are formed at a higher level of the ceramic layer 205 relative to the lower integrated circuit chip interface level of the ceramic layer 205. The third set of electrically conductive traces 231B for the clock bus electrically connect to corresponding conductive traces at the lower integrated circuit chip interface level of the ceramic layer 205 through via connections labeled 1-6. And, the first set of electrically conductive traces 231A for the power bus electrically connect to corresponding conductive traces at the lower integrated circuit chip interface level of the ceramic layer 205 through via connections labeled 7-12.

Additionally, in some embodiments, for signal noise reduction purposes, the fourth set of electrically conductive traces 229B for the data bus is terminated by a first resistor R1 disposed between the end of the data bus and the power bus formed by the first set of electrically conductive traces 231A. Similarly, for signal noise reduction purposes, the third set of electrically conductive traces 231B for the clock bus is terminated by a second resistor R2 disposed between the end of the clock bus and the power bus formed by the first set of electrically conductive traces 231A. Also, for signal noise reduction purposes, each of the four temperature measurement electrical devices 227 has a corresponding capacitor C1, C2, C3, 04 electrically connected between its power input terminal and the reference ground potential. It should be appreciated that each of the first resistor R1, the second resistor R2, and the capacitors C1, C2, C3, C4 are embedded within the ceramic layer 205. Therefore, it may not be necessary to have a signal noise control circuit disposed outside of the ceramic layer 205 in order to control signal noise along the different electrically conductive traces 229A, 229B, 231A, 231B, etc.

Figure 3C:
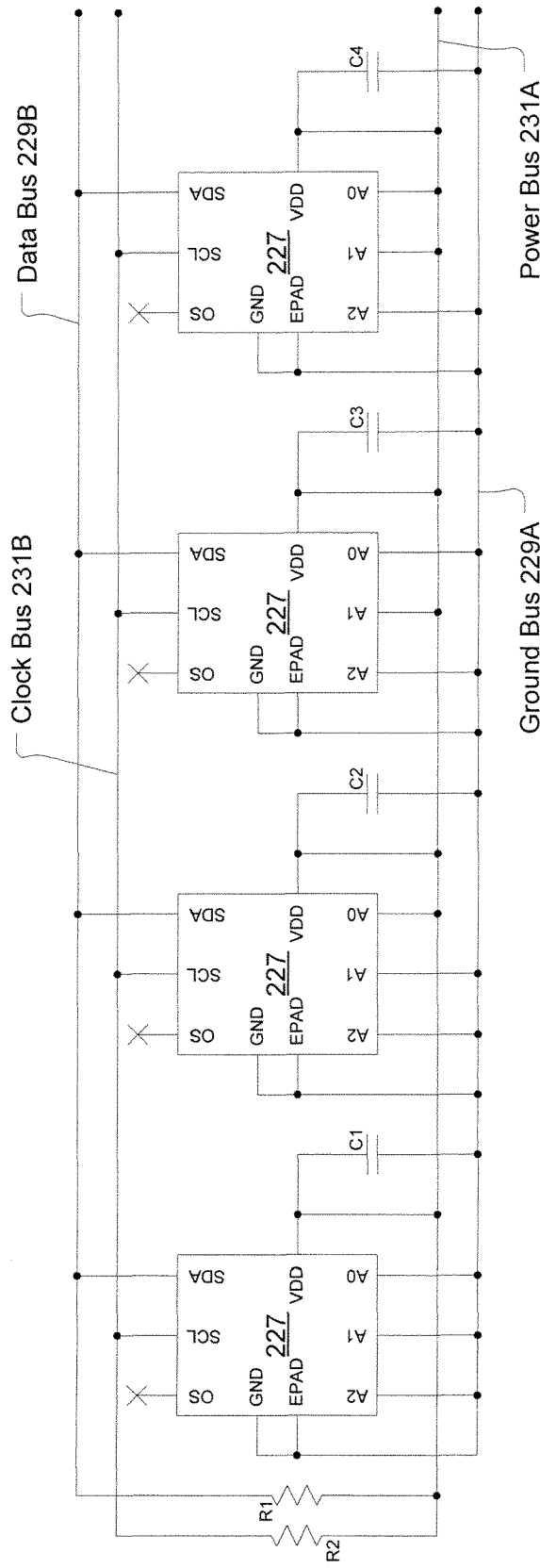
FIG. 3C shows an electrical schematic for the given one of the multiple temperature measurement arrays as depicted in FIG. 3B, in accordance with various embodiments of the present invention.

FIG. 3C shows an electrical schematic for the given one of the multiple temperature measurement arrays 301A, 301B, 301C, 301D as depicted in FIG. 3B, in accordance with various embodiments of the present invention. In this example, each of the temperature measurement electrical devices 227 is defined as an integrated circuit chip having a data port SDA, a clock port SCL, a reset port OS, a ground port GND, an exposed pad connection EPAD, a power port VDD, and three address ports A0, A1, A2. The three address ports A0, A1, A2 of each integrated circuit chip (227) can be connected to power and ground in different combinations to establish unique addressing of the different integrated circuit chips (227). Also, in some embodiments, each of the three address ports A0, A1, A2 of each integrated circuit chip (227) can be connected to either power, ground, the clock port SCL, or the data port SDA, in order to increase the number of unique address combinations and thereby provide for implementation of an increased number of uniquely addressable integrated circuit chips (227) within a given multiple temperature measurement array. In this manner, each integrated circuit chip (227) can have a unique trace design for unique addressing of the integrated circuit chip (227). For example, using a standard Inter-Integrated Circuit (I2C) serial interface protocol, each temperature measurement electrical device can be individually and uniquely addressed (based on the unique connection of its address ports). And, data packets received from the temperature measurement electrical devices can be identified based on the unique addressing of the various temperature measurement electrical devices. In various embodiments, the integrated circuit chips (227) can use either digital signals, analog signals, or a combination thereof. In one example embodiment, the integrated circuit chip (227) is implemented as a MAX31725 integrated circuit chip provided by Maxim Integrated Products, Inc. of San Jose, Calif., which utilizes the I2C serial interface. However, it should be understood that the MAX31725 integrated circuit chip is one of many different devices that can be used for the temperature measurement electrical devices 227. For example, in some embodiments, the integrated circuit chip (227) can be configured to utilize a Serial Peripheral Interface (SPI) protocol, or other bus-based communication protocol. Therefore, it should be understood that the present invention is not limited to use of the MAX31725 integrated circuit chip for the temperature measurement electrical devices 227 in all embodiments. It should be understood that the four temperature measurement electrical devices 227 within the multiple temperature measurement array of FIG. 3C is provided by way of example. In some embodiments, the number of temperature measurement electrical devices 227 within a given multiple temperature measurement array can be more than four. Additionally, in some embodiments, each of the temperature measurement electrical devices 227 can include a number of address ports that is more or less than the three address ports A0, A1, A2 as shown in the example of FIG. 3C.

In various embodiments of the substrate holder 102, both the number of temperature measurement electrical devices 227 per temperature measurement array, and the number and location of temperature measurement arrays can vary. For example, in various embodiments the substrate holder 102 can include one, two, three, four, five, six, seven, eight, etc., temperature measurement arrays. And, in some embodiments, different temperature measurement arrays within the same substrate holder 102 can include a different number of temperature measurement electrical devices 227.

Figure 4:
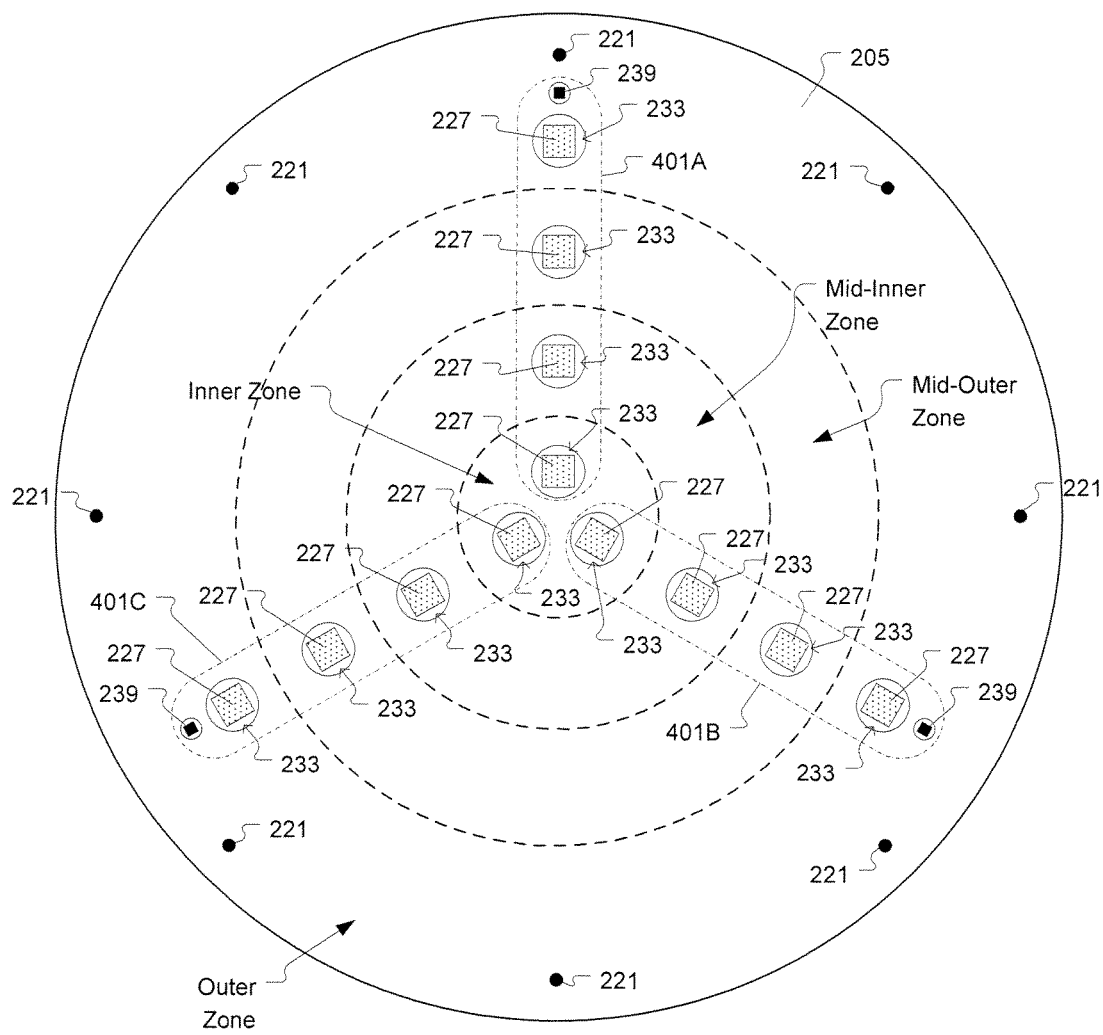
FIG. 4 shows an alternate arrangement of multiple temperature measurement arrays, in accordance with various embodiments of the present invention.

FIG. 4 shows an alternate arrangement of multiple temperature measurement arrays 301A, 301B, 301C, 301D, in accordance with various embodiments of the present invention. The alternate View A-A of FIG. 4 is referenced in FIG. 2A. In the example of FIG. 4, the substrate holder 102 includes three temperature measurement arrays 401A, 401B, 401C. Each temperature measurement array 401A, 401B, 401C includes four temperature measurement electrical devices 227 distributed among the four temperature measurement zones. In some embodiments, each of the temperature measurement electrical devices 227 is disposed within a respective recessed area 233 formed within the ceramic layer 205. In some embodiments, each of the temperature measurement electrical devices 227 can be attached to a bottom surface of the ceramic layer 205. Each of the temperature measurement arrays 401A, 401B, 401C includes a respective set of exposed electrical contacts 239 and a respective set of the plurality of electrical wires 237.

Figure 5:
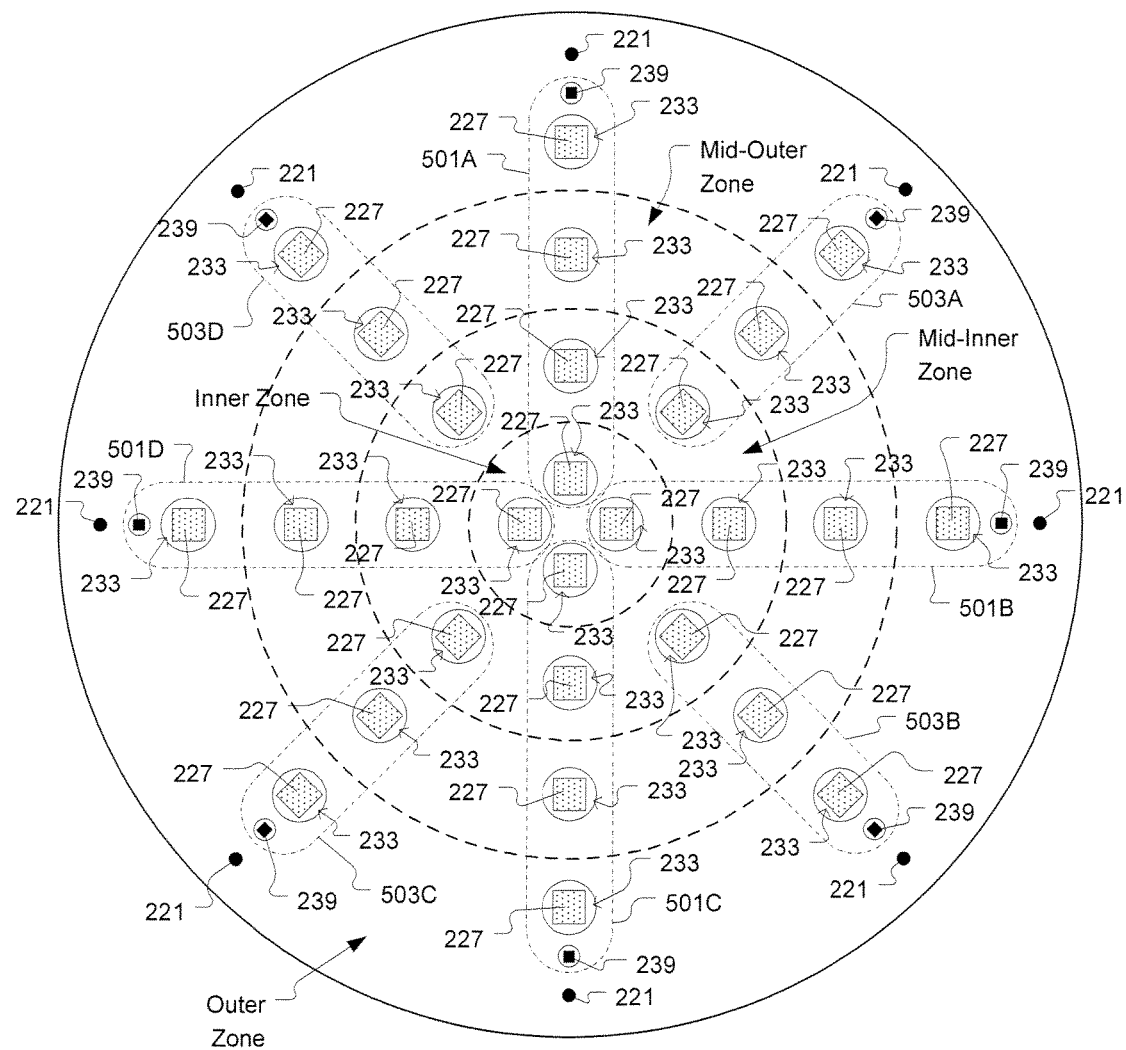
FIG. 5 shows another arrangement of multiple temperature measurement arrays, in accordance with various embodiments of the present invention.

FIG. 5 shows another arrangement of multiple temperature measurement arrays 501A, 501B, 501C, 501D, 503A, 503B, 503C, 503D in accordance with various embodiments of the present invention. The alternate View A-A of FIG. 5 is referenced in FIG. 2A. In the example of FIG. 5, the substrate holder 102 includes eight temperature measurement arrays 501A, 501B, 501O, 501D, 503A, 503B, 503O, 503D. Each temperature measurement array 501A, 501B, 501C, 501D includes four temperature measurement electrical devices 227 distributed among the four temperature measurement zones. And, each temperature measurement array 503A, 503B, 503C, 503D includes three temperature measurement electrical devices 227 distributed among three of the four temperature measurement zones. In some embodiments, each of the temperature measurement electrical devices 227 is disposed within a respective recessed area 233 formed within the ceramic layer 205. In some embodiments, each of the temperature measurement electrical devices 227 can be attached to a bottom surface of the ceramic layer 205. Each of the temperature measurement arrays 501A, 501B, 501C, 501D, 503A, 503B, 503C, 503D includes a respective set of exposed electrical contacts 239 and a respective set of the plurality of electrical wires 237. It should be appreciated that use of multiple independently operable temperature measurement arrays provides for redundancy in the event that one or more of the temperature measurement arrays becomes inoperable.

Figure 6:
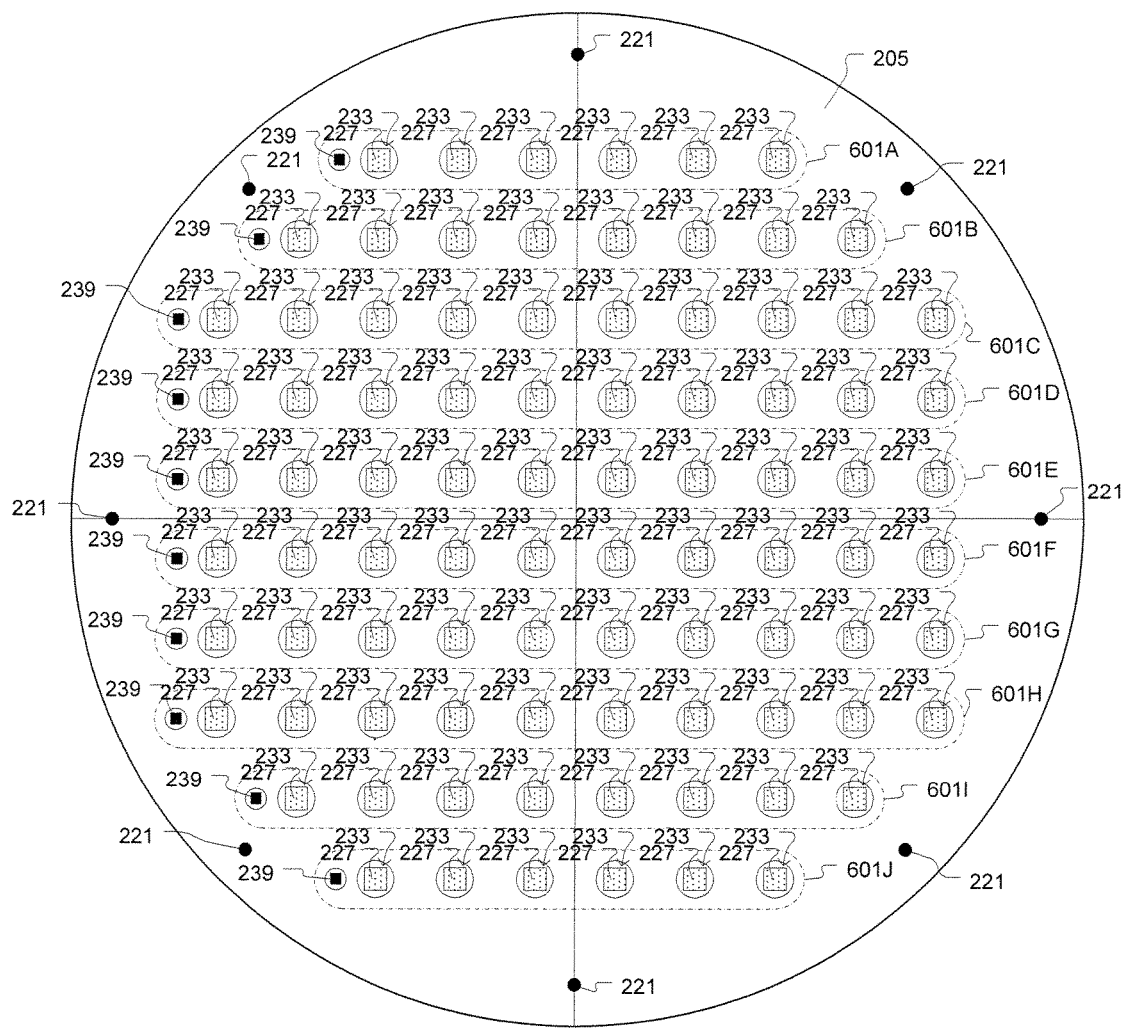
FIG. 6 shows another arrangement of multiple temperature measurement arrays, in accordance with various embodiments of the present invention.

FIG. 6 shows another arrangement of multiple temperature measurement arrays 601A, 601B, 601C, 601D, 601E, 601F, 601G, 601H, 601I, 601J, in accordance with various embodiments of the present invention. The alternate View A-A of FIG. 6 is referenced in FIG. 2A. In the example of FIG. 6, the substrate holder 102 includes a rectangular array of temperature measurement electrical devices 227. The temperature measurement electrical devices 227 of the rectangular array are delineated into the multiple temperature measurement arrays 601A, 601B, 601C, 601D, 601E, 601F, 601G, 601H, 601I, 601J, such that the temperature measurement electrical devices 227 of a given one of the multiple temperature measurement arrays are interconnected to share a single set of exposed electrical contacts 239 and a corresponding set of the plurality of electrical wires 237. In some embodiments, each of the temperature measurement electrical devices 227 is disposed within a respective recessed area 233 formed within the ceramic layer 205. In some embodiments, each of the temperature measurement electrical devices 227 can be attached to a bottom surface of the ceramic layer 205. It should be appreciated that different ones of the multiple temperature measurement arrays 601A, 601B, 601C, 601D, 601E, 601F, 601G, 601H, 601I, 601J include different numbers of temperature measurement electrical devices 227. Also, it should be understood that the depicted locations of the sets of exposed electrical contacts 239 are provided by way of example, and may be positioned in different locations in various embodiments.

Figure 7:
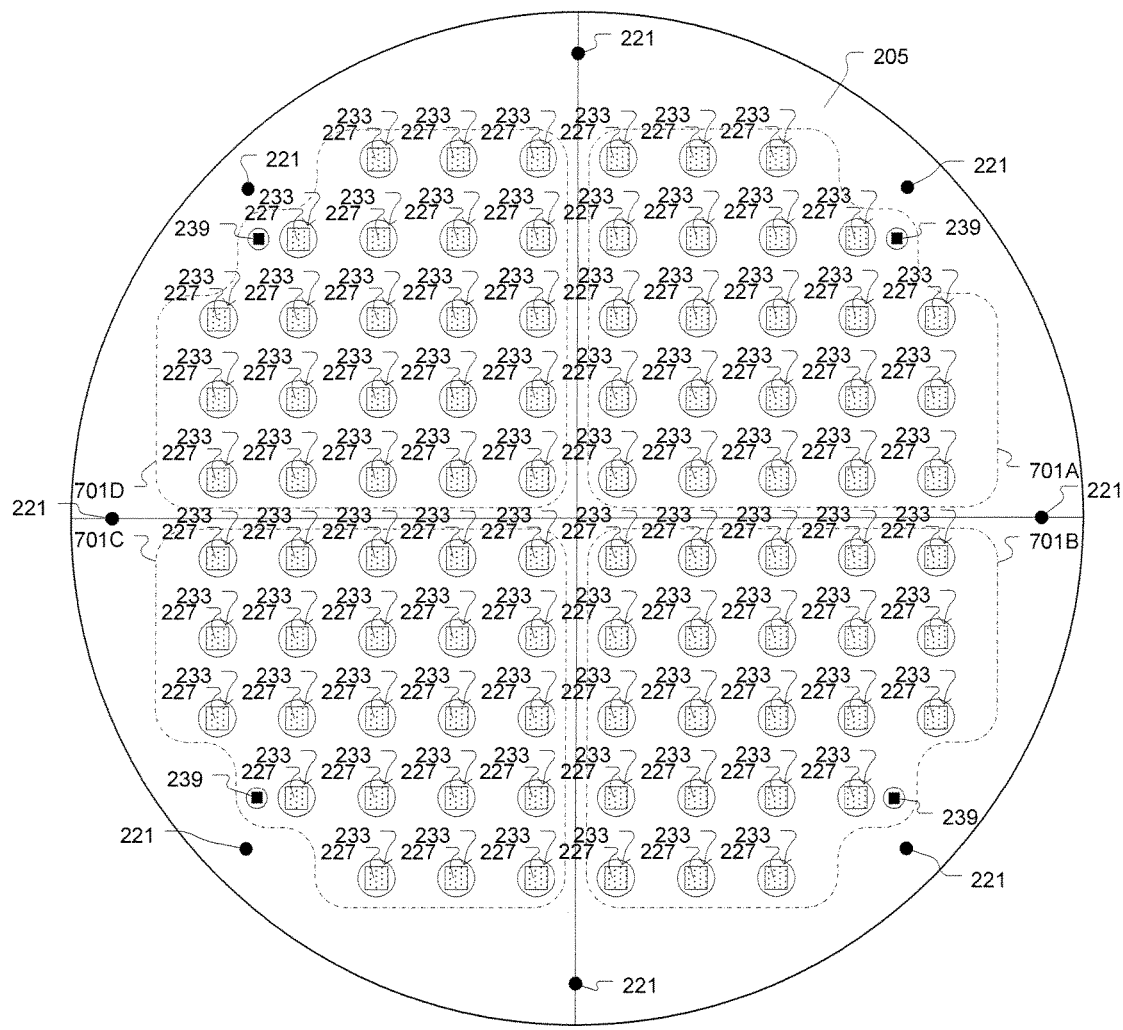
FIG. 7 shows a quadrant arrangement of multiple temperature measurement arrays, in accordance with various embodiments of the present invention.

FIG. 7 shows a quadrant arrangement of multiple temperature measurement arrays 701A, 701B, 701C, 701D, in accordance with various embodiments of the present invention. The alternate View A-A of FIG. 7 is referenced in FIG. 2A. In the example of FIG. 7, the substrate holder 102 includes a rectangular array of temperature measurement electrical devices 227. The temperature measurement electrical devices 227 of the rectangular array are delineated into the quadrant arrangement of multiple temperature measurement arrays 701A, 701B, 701C, 701D, such that the temperature measurement electrical devices 227 of a given quadrant, i.e., of a given one of the multiple temperature measurement arrays are interconnected to share a single set of exposed electrical contacts 239 and a corresponding set of the plurality of electrical wires 237. In some embodiments, each of the temperature measurement electrical devices 227 is disposed within a respective recessed area 233 formed within the ceramic layer 205. In some embodiments, each of the temperature measurement electrical devices 227 can be attached to a bottom surface of the ceramic layer 205. It should be understood that in different embodiments, different ones of the multiple temperature measurement arrays 701A, 701B, 701C, 701D can include different numbers of temperature measurement electrical devices 227. Also, it should be understood that the depicted locations of the sets of exposed electrical contacts 239 are provided by way of example, and may be positioned in different locations in various embodiments.

As demonstrated in FIGS. 3A, 4, and 5, a small size of the temperature measurement electrical devices 227 and an ability to add electrically conductive traces within the ceramic layer 205 as needed allows for distribution of redundant temperature measurement electrical devices 227 within a given temperature measurement zone, to allow for failure of one or more temperature measurement electrical devices 227 within a given temperature measurement zone. Also, the flexibility in how the temperature measurement electrical devices 227 can be spatially distributed with the ceramic layer 205 provides for improved accuracy in azimuthal measurement of the ceramic layer 205 temperatures about the centerline 247 of the ceramic layer 205. Also, in some embodiments, the number of temperature measurement electrical devices 227 can be larger than the prescribed number of temperature measurement zones, thereby providing for a higher density temperature measurement system.

Based on the foregoing, in an example embodiment, a system is disclosed to include the substrate holder 102, the number of temperature measurement electrical devices 227, the plurality of electrical wires 237, and the control circuit implemented on the circuit board 241. The substrate holder 102 includes the base plate 201 and the ceramic layer 205 attached to the top surface of the base plate 201 using the bond layer 203 disposed between the base plate 201 and the ceramic layer 205. The top surface of the ceramic layer includes the area configured to support the substrate 101. The number of temperature measurement electrical devices 227 are attached to the ceramic layer 205. Each of the number of temperature measurement electrical devices 227 is configured for measuring the corresponding local temperature of the ceramic layer 205. Each of the number of temperature measurement electrical devices 227 has a corresponding plurality of electrical contacts.

The ceramic layer 205 includes a plurality of electrically conductive traces 229A, 229B, 231A, 231B, etc., embedded within the ceramic layer 205. Some of the plurality of electrically conductive traces 229A, 229B, 231A, 231B, etc., are routed between electrical contacts of the number of temperature measurement electrical devices 227. Some of the plurality of electrically conductive traces 229A, 229B, 231A, 231B, etc., are routed from one or more of the plurality of electrical contacts of the number of temperature measurement electrical devices 227 to corresponding ones of the number of exposed electrical contacts 239. The plurality of electrical wires 237 are connected to corresponding ones of the number of exposed electrical contacts 239. The control circuit includes a plurality of electrical nodes respectively in electrical contact with the plurality of electrical wires 237. The control circuit is configured to control operation of the number of temperature measurement electrical devices 227 and receive temperature measurement data from the number of temperature measurement electrical devices 227.

By having the temperature measurement electrical devices 227 and their corresponding electrically conductive traces embedded within the ceramic layer 205 it is possible to pre-calibrate the temperature measurement performance of the substrate holder 102 before it is installed within the process module 100, and even before the substrate holder 102 is shipped to a semiconductor fabrication facility. This pre-calibration of the temperature measurement performance of the substrate holder 102 provides for significant cost savings and provides for more consistent calibration between different substrate holders 102.

Figure 8:
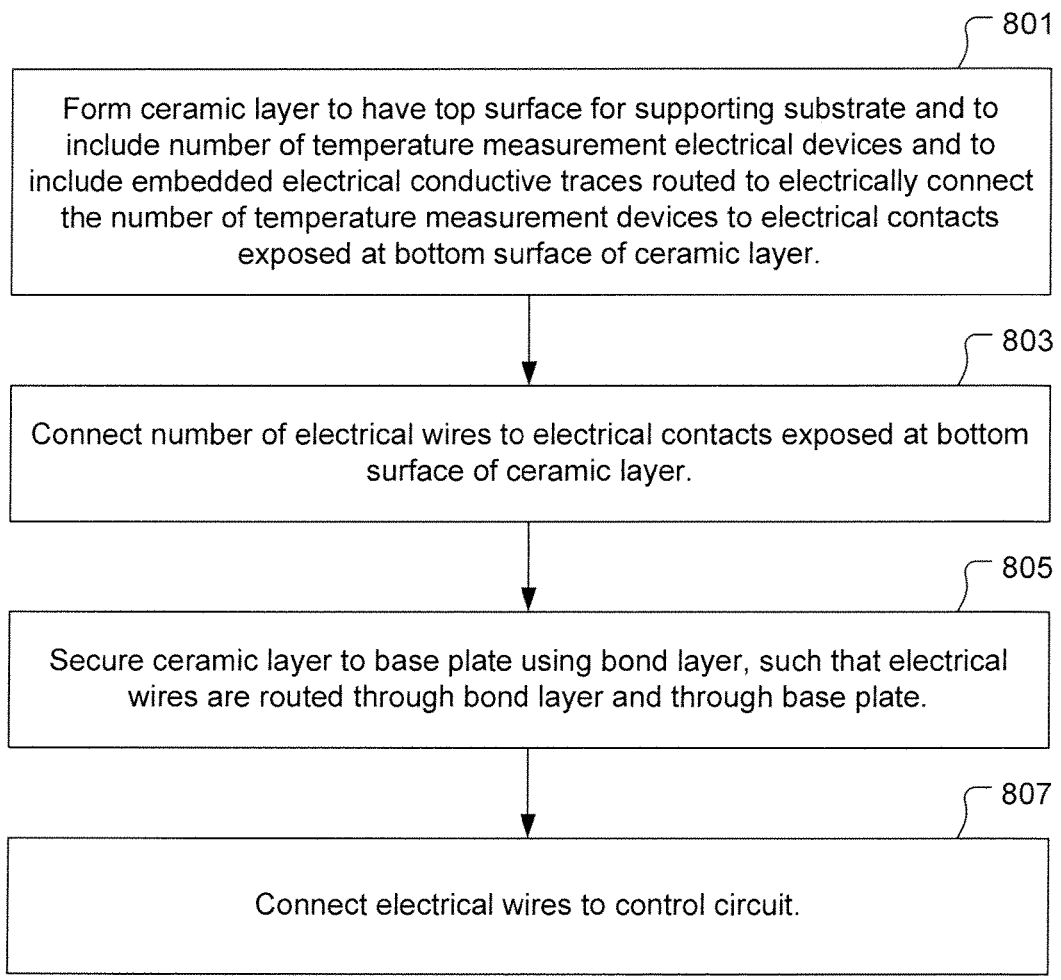
FIG. 8 shows a flowchart of a method for manufacturing a substrate holder, in accordance with various embodiments of the present invention.

FIG. 8 shows a flowchart of a method for manufacturing a substrate holder, in accordance with various embodiments of the present invention. The method includes an operation 801 for forming a ceramic layer 205. The ceramic layer 205 is formed to have a top surface including an area configured to support a substrate 101. The ceramic layer 205 is also formed to include a number of temperature measurement electrical devices 227. In some embodiments, each of the number of temperature measurement electrical devices is a corresponding integrated circuit chip. In some embodiments, forming the ceramic layer 205 in operation 801 includes forming a number of recessed areas 233 distributed across a bottom surface of the ceramic layer 205. Each of the number of recessed areas 233 is configured to receive a corresponding one of the number of temperature measurement electrical devices 227, such that each of the number of temperature measurement electrical devices 227 is located between the top surface of the ceramic layer 205 and a bottom surface of the ceramic layer 205 when disposed within its recessed area 233.

The ceramic layer 205 is also formed to include embedded electrically conductive traces 229A, 229B, 231A, 231B, etc., routed to electrically connect the number of temperature measurement electrical devices 227 to a number of exposed electrical contacts 239 at a bottom surface of the ceramic layer 205. In some embodiments, the embedded electrically conductive traces 229A, 229B, 231A, 231B, etc., are routed through multiple levels of the ceramic layer 205 using electrically conductive via structures 235 formed to extend vertically within the ceramic layer 205. In some embodiments, forming the ceramic layer 205 in operation 801 includes co-firing the embedded electrically conductive traces 229A, 229B, 231A, 231B, etc., with the ceramic layer 205 such that the embedded electrically conductive traces 229A, 229B, 231A, 231B, etc., have a temperature response substantially equal to a temperature response of the ceramic layer 205.

The method also includes an operation 803 for connecting a number of electrical wires 237 to the number of exposed electrical contacts 239, respectively. The method also includes an operation 805 for securing the ceramic layer 205 to a base plate 201 using a bond layer 203, such that the number of electrical wires 237 are routed through the bond layer 203 and through the base plate 201. The method also includes an operation 807 for connecting the number of electrical wires 237 to a control circuit. In some embodiments, the method includes implementing the control circuit on a circuit board 241 and disposing the circuit board 241 below the base plate 201 within a facilities module 206.

Figure 9:
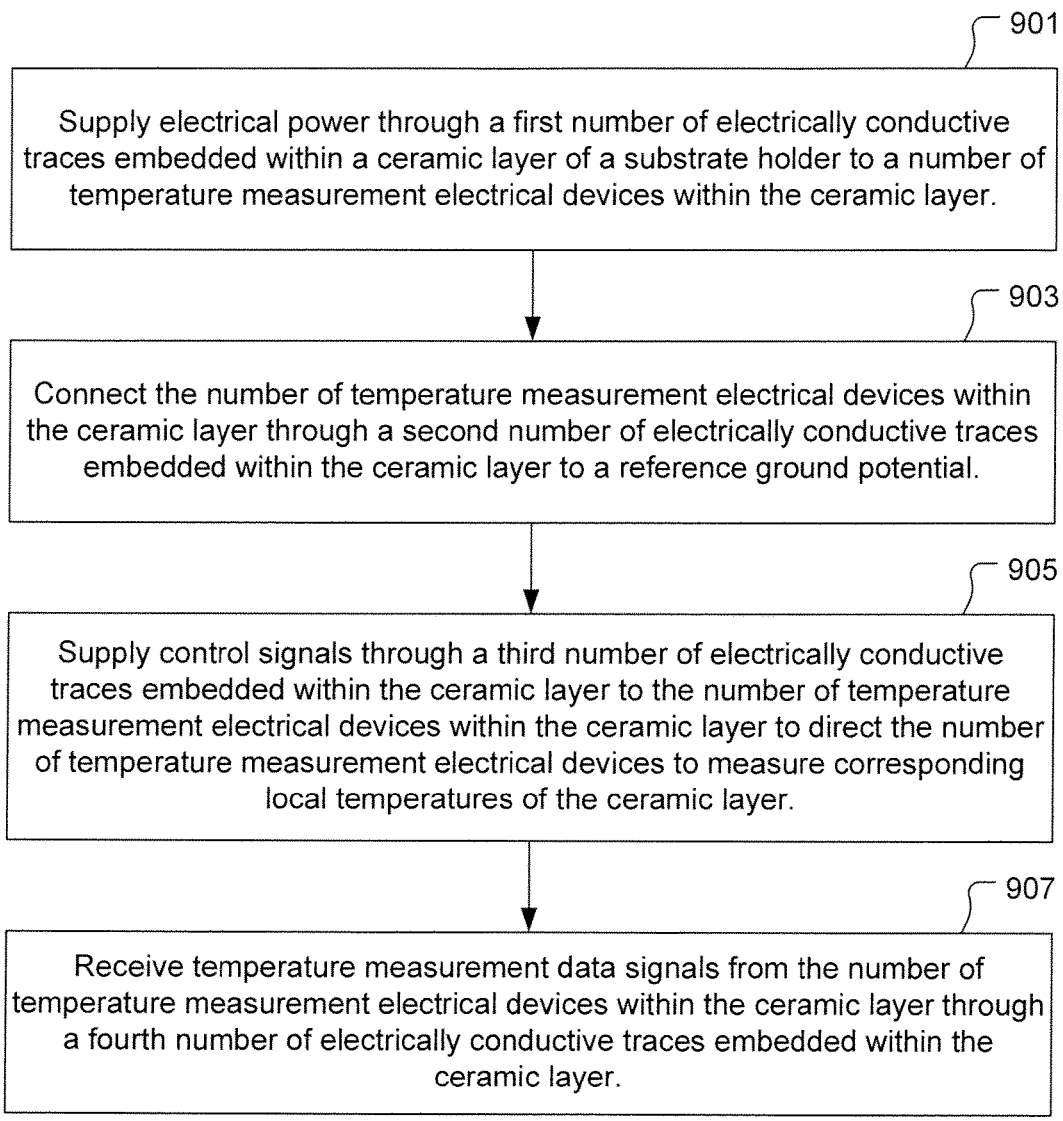
FIG. 9 shows a flowchart of a method for measuring temperature of a substrate holder, in accordance with various embodiments of the present invention.

FIG. 9 shows a flowchart of a method for measuring temperature of a substrate holder, in accordance with various embodiments of the present invention. The method includes an operation 901 for supplying electrical power through a first number of electrically conductive traces 231A embedded within a ceramic layer 205 of the substrate holder 102 to a number of temperature measurement electrical devices 227 within the ceramic layer 205. The method also includes an operation 903 for connecting the number of temperature measurement electrical devices 227 within the ceramic layer 205 through a second number of electrically conductive traces 229A embedded within the ceramic layer 205 to a reference ground potential. The method also includes an operation 905 for supplying control signals through a third number of electrically conductive traces 231B embedded within the ceramic layer 205 of the substrate holder 102 to the number of temperature measurement electrical devices 227 within the ceramic layer 205 to direct the number of temperature measurement electrical devices 227 to measure corresponding local temperatures of the ceramic layer 205. The method also includes an operation 907 for receiving temperature measurement data signals from the number of temperature measurement electrical devices 227 within the ceramic layer 205 through a fourth number of electrically conductive traces 229B embedded within the ceramic layer 205 of the substrate holder 102. In some embodiments, each of the number of temperature measurement electrical devices 227 is a corresponding integrated circuit chip.

Based on the foregoing, it should be appreciated that the number of temperature measurement electrical devices 227 are permanently mounted within the ceramic layer 205 of the substrate holder 102, such that the temperature measurement electrical devices 227 will not be subjected to damage in handling. Also, because the number of temperature measurement electrical devices 227 are mounted in extremely good thermal contact with the ceramic layer 205, e.g., by soldering, the temperature measurement electrical devices 227 will provide an accurate temperature measurement independent of the cooler base plate 201 temperature. Moreover, the temperature measurement electrical devices 227 and formation of their corresponding electrically conductive traces within the ceramic layer 205 should provide a low cost means for improving reliability and accuracy of temperature measurement of the ceramic layer 205. Also, because the temperature measurement electrical devices 227 can be calibrated with the ceramic layer outside of the process module 100, accuracy in substrate 101 temperature measurement and repeatability in temperature measurement from substrate-to-substrate should improve.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the described embodiments.

What is claimed is:

1. A substrate holder, comprising:
   a base plate;
   a bond layer disposed over the base plate;
   a ceramic layer disposed over and in contact with the bond layer, the ceramic layer having a top surface including an area configured to support a substrate;
   a number of temperature measurement electrical devices attached to the ceramic layer, each of the number of temperature measurement electrical devices configured for measuring a corresponding local temperature of the ceramic layer, each of the number of temperature measurement electrical devices having a plurality of electrical contacts, wherein the ceramic layer includes a number of recessed areas distributed across a bottom surface of the ceramic layer, each of the number of recessed areas formed to extend through less than a total thickness of the ceramic layer, each of the number of recessed areas configured to receive a corresponding one of the number of temperature measurement electrical devices, such that each of the number of temperature measurement electrical devices is located between the top and bottom surfaces of the ceramic layer when disposed within its recessed area; and
   a plurality of electrically conductive traces embedded within the ceramic layer, some of the plurality of electrically conductive traces positioned in electrical contact with one or more of the plurality of electrical contacts of the number of temperature measurement electrical devices.

2. The substrate holder as recited in claim 1, further comprising:
   a plurality of electrical wires in electrical contact with one or more of the plurality of electrically conductive traces, the plurality of electrical wires extending from the ceramic layer through the bond layer and through the base plate to a control circuit implemented on a printed circuit board.

3. The substrate holder as recited in claim 1, further comprising:
   a number of mounting pads respectively secured within the number of recessed areas, each of the number of temperature measurement electrical devices physically connected to a respective one of the number of mounting pads, the number of mounting pads providing thermal contact between the number of temperature measurement electrical devices and the ceramic layer.

4. The substrate holder as recited in claim 1, further comprising:
   a backfill material disposed within each of the number of recessed areas to cover the corresponding number of temperature measurement electrical devices and fill each of the number of recessed areas to a level substantially even with the bottom surface of the ceramic layer.

5. The substrate holder as recited in claim 1, wherein each of the number of temperature measurement electrical devices is a separate integrated circuit chip.

6. The substrate holder as recited in claim 1, wherein the plurality of electrically conductive traces are co-fired with the ceramic layer such that the plurality of electrically conductive traces have a temperature response substantially equal to a temperature response of the ceramic layer.

7. The substrate holder as recited in claim 1, wherein the plurality of electrically conductive traces include one or more of tungsten, platinum, and molybdenum as an electrical conductor.

8. The substrate holder as recited in claim 1, wherein the plurality of electrically conductive traces are routed through multiple levels of the ceramic layer using electrically conductive via structures formed to extend vertically within the ceramic layer.

9. The substrate holder as recited in claim 1, wherein the number of temperature measurement electrical devices are distributed within multiple temperature measurement zones, the multiple temperature measurement zones defined in a concentric manner about a centerline of the ceramic layer extending perpendicularly through a center of the top surface of the ceramic layer.

10. The substrate holder as recited in claim 1, wherein the number of temperature measurement electrical devices are distributed in a rectangular matrix arrangement across the ceramic layer.

11. The substrate holder as recited in claim 9, wherein the number of temperature measurement electrical devices and the plurality of electrically conductive traces embedded within the ceramic layer are separated into multiple temperature measurement arrays, wherein each of the multiple temperature measurement arrays includes separate temperature measurement electrical devices respectively positioned within different ones of the multiple temperature measurement zones and a dedicated set of the plurality of electrically conductive traces embedded within the ceramic layer.

12. The substrate holder as recited in claim 11, wherein a number of the multiple temperature measurement arrays is within a range from one to eight.

13. The substrate holder as recited in claim 2, wherein the control circuit includes a plurality of electrical nodes respectively in electrical contact with the plurality of electrical wires, the control circuit configured to control operation of the number of temperature measurement electrical devices.

14. The substrate holder as recited in claim 13, wherein the control circuit is implemented within a circuit board singularly associated with the substrate holder, and wherein the circuit board is disposed below the base plate, and wherein the circuit board includes a data jack for communication of any type of data to and from a computer external to the substrate holder.

15. The substrate holder as recited in claim 2, wherein the number of temperature measurement electrical devices and the plurality of electrically conductive traces embedded within the ceramic layer and the plurality of electrical wires are separated into multiple temperature measurement arrays, wherein each of the multiple temperature measurement arrays includes at least two temperature measurement electrical devices and a dedicated set of the plurality of electrically conductive traces embedded within the ceramic layer and a dedicated set of the plurality of electrical wires.

16. The substrate holder as recited in claim 15, wherein each of the temperature measurement electrical devices of a given one of the multiple temperature measurement arrays is a corresponding integrated circuit chip.

17. The substrate holder as recited in claim 16, wherein the plurality of electrically conductive traces for the given one of the multiple temperature measurement arrays includes a first set of electrically conductive traces for supply of electrical power to each of the integrated circuit chips within the given one of the multiple temperature measurement arrays, and a second set of electrically conductive traces to provide a reference ground potential to each of the integrated circuit chips within the given one of the multiple temperature measurement arrays, and a third set of electrically conductive traces forming a clock bus in connection with each of the integrated circuit chips within the given one of the multiple temperature measurement arrays, and a fourth set of electrically conductive traces for communication of data to and from each of the integrated circuit chips within the given one of the multiple temperature measurement arrays, wherein the data includes temperature measurement data as measured by the number of temperature measurement electrical devices.

18. The substrate holder as recited in claim 17, wherein the plurality of electrical wires for the given one of the multiple temperature measurement arrays includes a first wire for supplying electrical power of the first set of electrically conductive traces, and a second wire for connecting the second set of electrically conductive traces to the reference ground potential, and a third wire for connection to the clock bus, and a fourth wire for communicating data to and from the fourth set of electrically conductive traces.

19. A method for measuring temperature of a substrate, comprising:
  providing a substrate holder, the substrate holder including
    a base plate,
    a bond layer disposed over the base plate,
    a ceramic layer disposed over and in contact with the bond layer, the ceramic layer having a top surface including an area configured to support a substrate,
    a number of temperature measurement electrical devices attached to the ceramic layer, each of the number of temperature measurement electrical devices configured for measuring a corresponding local temperature of the ceramic layer, each of the number of temperature measurement electrical devices having a plurality of electrical contacts, wherein the ceramic layer includes a number of recessed areas distributed across a bottom surface of the ceramic layer, each of the number of recessed areas formed to extend through less than a total thickness of the ceramic layer, each of the number of recessed areas configured to receive a corresponding one of the number of temperature measurement electrical devices, such that each of the number of temperature measurement electrical devices is located between the top and bottom surfaces of the ceramic layer when disposed within its recessed area, and
    a plurality of electrically conductive traces embedded within the ceramic layer, some of the plurality of electrically conductive traces positioned in electrical contact with one or more of the plurality of electrical contacts of the number of temperature measurement electrical devices; and
  operating the number of temperature measurement electrical devices to measure a corresponding local temperature of the ceramic layer when a substrate is present on the substrate holder.

20. The substrate holder as recited in claim 19, wherein each of the number of temperature measurement electrical devices is a separate integrated circuit chip.

21. The substrate holder as recited in claim 19, wherein operating the number of temperature measurement electrical devices includes supplying electrical power to each of the temperature measurement electrical devices, and supplying a reference ground potential to each of the temperature measurement electrical devices, and supplying a clock signal to each of the temperature measurement electrical devices, and communicating data to and from each of the temperature measurement electrical devices, wherein the data includes temperature measurement data as measured by the number of temperature measurement electrical devices.

22. A method for manufacturing a substrate holder, comprising:
  forming a ceramic layer having a top surface including an area configured to support a substrate, the ceramic layer formed to include a number of temperature measurement electrical devices, the ceramic layer formed to include embedded electrically conductive traces routed to electrically connect the number of temperature measurement electrical devices to a number of exposed electrical contacts at a bottom surface of the ceramic layer, wherein forming the ceramic layer includes forming a number of recessed areas distributed across a bottom surface of the ceramic layer, each of the number of recessed areas formed to extend through less than a total thickness of the ceramic layer, each of the number of recessed areas configured to receive a corresponding one of the number of temperature measurement electrical devices, such that each of the number of temperature measurement electrical devices is located between the top surface of the ceramic layer and a bottom surface of the ceramic layer when disposed within its recessed area;
  connecting a number of electrical wires to the number of exposed electrical contacts, respectively;
  securing the ceramic layer to a base plate using a bond layer, the ceramic layer in contact with the bond layer, such that the number of electrical wires are routed through the bond layer and through the base plate; and
  connecting the number of electrical wires to a control circuit.

23. The method as recited in claim 22, wherein forming the ceramic layer includes co-firing the embedded electrically conductive traces with the ceramic layer such that the embedded electrically conductive traces have a temperature response substantially equal to a temperature response of the ceramic layer.

24. The method as recited in claim 23, wherein the embedded electrically conductive traces are routed through multiple levels of the ceramic layer using electrically conductive via structures formed to extend vertically within the ceramic layer.

25. The method as recited in claim 22, wherein each of the number of temperature measurement electrical devices is a corresponding integrated circuit chip.

* * * * *